United States Patent
Yang et al.

(10) Patent No.: US 10,615,765 B2
(45) Date of Patent: Apr. 7, 2020

(54) SOUND ADJUSTMENT METHOD AND SYSTEM

(71) Applicant: Unlimiter MFA Co., Ltd., Eden Island (SC)

(72) Inventors: Kuo-Ping Yang, Taipei (TW); Ho-Hsin Liao, Taipei (TW); Neo Bob Chih-Yung Young, Taipei (TW); Kuan-Li Chao, Taipei (TW); Chih-Long Chang, Taipei (TW)

(73) Assignee: UNLIMITER MFA CO., LTD., Eden Island (SC)

( * ) Notice: Subject to any disclaimer, the term of this patent is extended or adjusted under 35 U.S.C. 154(b) by 0 days.

(21) Appl. No.: 16/102,809

(22) Filed: Aug. 14, 2018

(65) Prior Publication Data
US 2019/0334495 A1 Oct. 31, 2019

(30) Foreign Application Priority Data
Apr. 27, 2018 (TW) .............................. 107114504 A

(51) Int. Cl.
*H03G 5/16* (2006.01)
*G10L 15/22* (2006.01)
*H04R 3/04* (2006.01)

(52) U.S. Cl.
CPC ............. *H03G 5/165* (2013.01); *G10L 15/22* (2013.01); *H04R 3/04* (2013.01)

(58) Field of Classification Search
CPC ........ H04R 2227/009; H04M 2201/40; H04M 2250/74; G10L 25/78; G10L 25/84; G10L 15/20; G10L 15/22; G10L 15/08; G10L 15/26; G10L 2021/0135; G10L 21/003; G10L 15/00; H04S 2400/15
USPC ...... 381/103, 56, 57, 107, 58; 704/233, 246, 704/251
See application file for complete search history.

(56) References Cited

U.S. PATENT DOCUMENTS 9,305,530 B1 * 4/2016 Durham ............... G10H 1/0008
2015/0237454 A1 * 8/2015 Scheirer .................... H04S 5/00
381/17

\* cited by examiner

*Primary Examiner* — Norman Yu
(74) *Attorney, Agent, or Firm* — Bacon & Thomas, PLLC

(57) ABSTRACT

A sound adjustment method applied to a sound adjustment system is disclosed. The sound adjustment system includes a sound receiving module, a sound identification module, a sound frequency conversion module and a sound equalizer. The sound adjustment method includes the steps of: receiving a sound signal via the sound receiving module; identifying the sound signal via the sound identification module to determine a type of the sound signal; if the sound signal is a voice signal, executing a frequency conversion of the voice signal via the sound frequency conversion module such that the voice signal becomes a frequency-converted voice signal; if the sound signal is a non-voice signal, adjusting the non-voice signal via the sound equalizer such that the non-voice signal becomes an equalizer-adjusted sound signal.

6 Claims, 2 Drawing Sheets

SOUND ADJUSTMENT METHOD AND SYSTEM

BACKGROUND OF THE INVENTION

1. Field of the Invention

The present invention relates to a sound adjustment method and system; more particularly, the present invention relates to a sound adjustment method and system which can automatically adjust the sound according to the type of the sound to provide a better listening experience to the audience.

2. Description of the Related Art

People often watch television (such as watching movies, TV series, music shows or talk shows) or listen to the radio (such as listening to music shows or talk shows) at home to relax. However, for old people with hearing impairment, it is hard to clearly hear the conversations in movies, TV series and talk shows.

In addition, when people use a computer to listen to music, people usually like to use the equalizer of the media player in the computer to adjust the sound of the music; for example, a user may increase the bass on the equalizer to enhance the subwoofer effect of the music and make the music sound more powerful. However, if the user first listens to music and then listens to a talk show, the user must manually cancel the equalizer settings for music, which is inconvenient for the user.

Therefore, to solve the abovementioned problems, there is a need to provide a new sound adjustment method to automatically adjust the sound according to the type of the sound.

SUMMARY OF THE INVENTION

It is an object of the present invention to provide a sound adjustment method which can automatically adjust the sound according to the type of the sound to provide a better listening experience to the audience.

To achieve the abovementioned object, a sound adjustment method of the present invention is applied to a sound adjustment system. The sound adjustment system includes a sound receiving module, a sound identification module, a sound frequency conversion module and a sound equalizer. The sound adjustment method includes: via the sound receiving module, receiving a sound signal; via the sound identification module, identifying the sound signal to determine a type of the sound signal; if the sound signal is a voice signal, executing a frequency conversion of the voice signal via the sound frequency conversion module such that the voice signal becomes a frequency-converted voice signal; if the sound signal is a non-voice signal, adjusting the non-voice signal via the sound equalizer such that the non-voice signal becomes an equalizer-adjusted sound signal.

According to one embodiment of the present invention, the sound identification module is used for identifying if the sound signal can be converted to text to determine if the sound signal is a voice signal.

According to one embodiment of the present invention, the sound adjustment system further includes a sound outputting module, the sound outputting module is electrically connected to the sound frequency conversion module and the sound equalizer, and the sound outputting module is used for outputting the frequency-converted voice signal or the equalizer-adjusted sound signal.

The other object of the present invention is to provide a sound adjustment system which can automatically adjust the sound according to the type of the sound to provide a better listening experience to the audience.

To achieve the abovementioned object, a sound adjustment system of the present invention includes a sound receiving module, a sound identification module, a sound frequency conversion module and a sound equalizer. The sound receiving module is used for receiving a sound signal. The sound identification module is electrically connected to the sound receiving module. The sound identification module is used for identifying the sound signal to determine a type of the sound signal. The sound frequency conversion module is electrically connected to the sound identification module. The sound equalizer is electrically connected to the sound identification module. If the sound identification module determines that the sound signal is a voice signal, the sound frequency conversion module will execute a frequency conversion of the voice signal such that the voice signal becomes a frequency-converted voice signal; if the sound identification module determines that the sound signal is a non-voice signal, the sound equalizer will adjust the sound signal such that the non-voice signal becomes an equalizer-adjusted sound signal.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1:
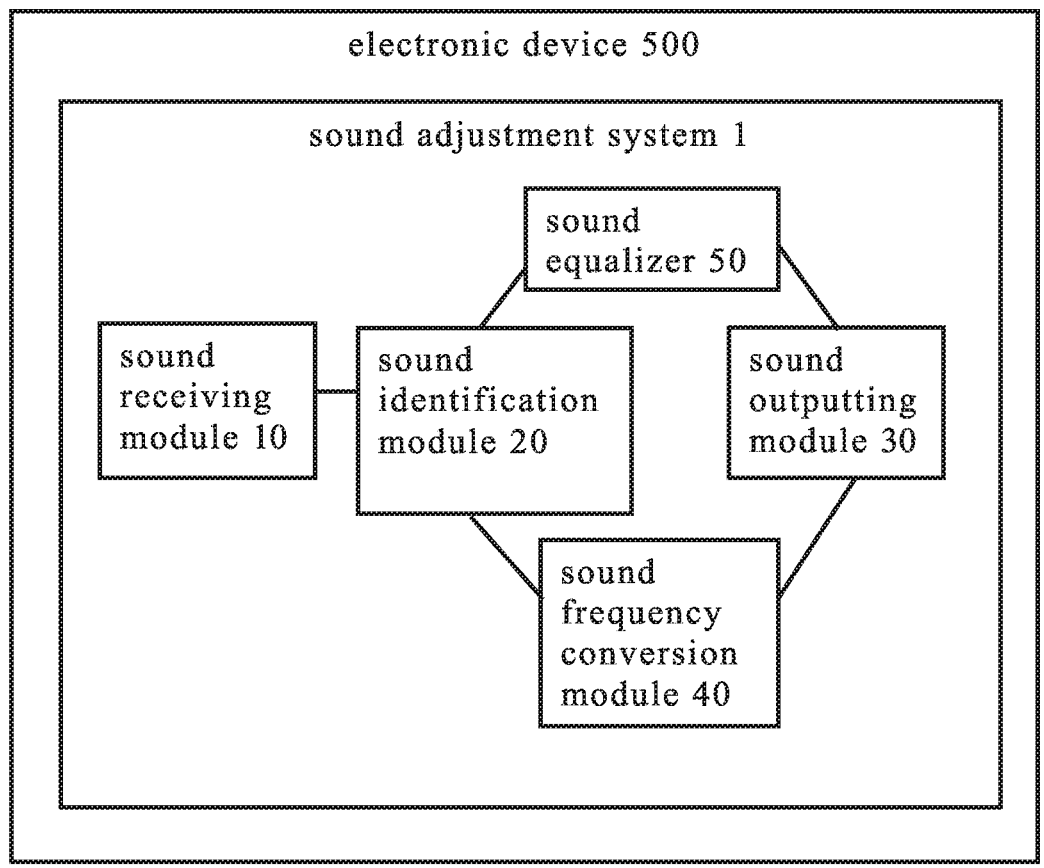
FIG. 1 illustrates a system structure drawing of the sound adjustment system in one embodiment of the present invention.
Figure 2:
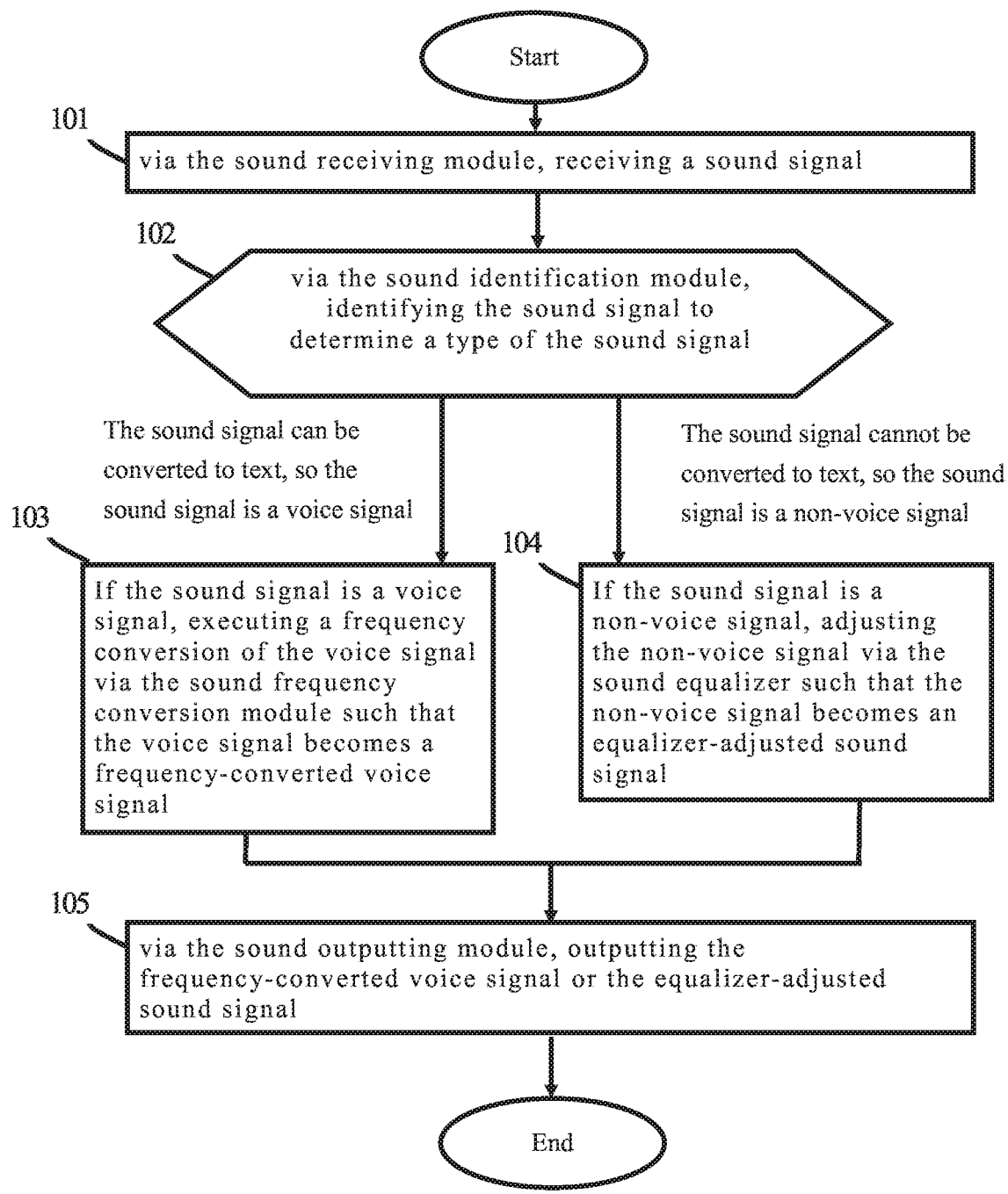
FIG. 2 illustrates a flowchart of the sound adjustment method in one embodiment of the present invention.

Please refer to FIG. 1 and FIG. 2 regarding the sound adjustment system and method of the present invention. FIG. 1 illustrates a system structure drawing of the sound adjustment system in one embodiment of the present invention. FIG. 2 illustrates a flowchart of the sound adjustment method in one embodiment of the present invention.

As shown in FIG. 1 and FIG. 2, in one embodiment of the present invention, the sound adjustment method of the present invention is programmed into a computer program, which is applied to a sound adjustment system 1 of an electronic device 500. The sound adjustment method is used for automatically adjusting the sound according to the type of the sound to provide a better listening experience to the audience. The electronic device 500 is a television, a computer, a smartphone, or other device with the function of playing video or audio media. The electronic device 500 includes a sound adjustment system 1. The sound adjustment system 1 is used for receiving the external sound signal, determining the type of the sound signal to correspondingly adjust the sound signal, and outputting the adjusting sound signal. The sound adjustment system 1 includes a sound receiving module 10, a sound identification module 20, a sound outputting module 30, a sound frequency conversion module 40 and a sound equalizer 50.

In one embodiment of the present invention, the sound receiving module 10 is used for receiving an external sound signal and sending the sound signal to the sound identification module 20; the sound signal can be a sound of a program played by the electronic device 500 or a sound received by a microphone of the electronic device 500. The sound identification module 20 is electrically connected to the sound receiving module 10. The sound identification module 20 is used for identifying the sound signal to determine the type of the sound signal. The sound frequency conversion module 40 is electrically connected to the sound identification module 20. The sound frequency conversion module 40 is used for executing a frequency conversion of the voice signal such that the voice signal becomes a frequency-converted voice signal. The sound equalizer 50 is electrically connected to the sound identification module 20. The sound equalizer 50 is used for adjusting the sound signal such that the sound signal becomes an equalizer-adjusted sound signal. The sound outputting module 30 is a speaker, which is electrically connected to the sound frequency conversion module 40 and the sound equalizer 50. The sound outputting module 30 is used for outputting the frequency-converted voice signal or the equalizer-adjusted sound signal to the outside.

In one embodiment of the present invention, when the user uses the electronic device 500 to watch a program, the sound adjustment system 1 will start the computer program of the sound adjustment method and execute Step 101: via the sound receiving module, receiving a sound signal.

When the user uses the electronic device 500 to watch a program, the sound signal of the program will be sent to the electronic device 500 from the outside, whereupon the sound signal will be received by the sound receiving module 10 of the sound adjustment system 1.

Then the sound adjustment system 1 will execute Step 102: via the sound identification module, identifying the sound signal to determine a type of the sound signal, wherein the sound identification module is used for identifying if the sound signal can be converted to text to determine if the sound signal is a voice signal.

In one embodiment of the present invention, after the sound receiving module 10 receives the sound signal, the sound receiving module 10 will send the sound signal to the sound identification module 20. The sound identification module 20 will identify if the type of the sound signal is a voice signal or a non-voice signal (such as a musical instrument signal). The sound identification module 20 identifies if the content of the sound signal can be converted to text via voice recognition technology; if the content of the sound signal can be converted to text, the sound signal will be identified as a voice signal; in contrast, if the content of the sound signal cannot be converted to text, the sound signal will be identified as a non-voice signal. Regarding voice recognition technology, please refer to the following papers on the research and application of voice recognition technology: "A comparison of features for speech, music discrimination" published in 1999, "Real-time discrimination of broadcast speech/music" published in 1996, "Speech/music discrimination based on posterior probability features" published in 1999, "A speech/music discriminator based on RMS and zero-crossings" published in 2005, "Robust speech music discrimination using spectrum's first order statistics and neural networks" published in 2003, "A fast and robust speech/music discrimination approach" published in 2003, "A wavelet-based parameterization for speech/music discrimination" published in 2010, "Music tonality features for speech/music discrimination" published in 2014, "Speech-music discrimination: A deep learning perspective" published in 2014, "Speech/Music Discrimination Using a Single Warped LPC-Based. Feature" published in 2005, and "Novel Features for Effective Speech and Music Discrimination" published in 2006. It is to be understood that the details of the voice recognition technology are not the focus of this invention and are already specified by the abovementioned papers; therefore, there is no need for further description of the voice recognition technology.

In one embodiment of the present invention, if the sound identification module 20 identifies that the content of the sound signal can be converted to text via voice recognition technology, the sound identification module 20 will determine that the sound signal is a voice signal; at this moment, the sound adjustment system 1 will execute Step 103: if the sound signal is a voice signal, executing a frequency conversion of the voice signal via the sound frequency conversion module such that the voice signal becomes a frequency-converted voice signal.

After the sound identification module 20 determines that the sound signal is a voice signal, the determined result will be sent to the sound frequency conversion module 40, and the sound frequency conversion module 40 will execute a frequency conversion of the voice signal such that the voice signal becomes a frequency-converted voice signal. In one embodiment of the present invention, the frequency conversion executed by the sound frequency conversion module 40 increases the gain of the sound signal in a specific frequency range of the voice signal such that the sound of the specific frequency range is obvious; for example, the sound frequency conversion module 40 can increase the gain of the sound signal in the low frequency range (which is under 500 Hz) such that sounds in the low frequency range are obvious; thus, old people with high frequency hearing loss will easily hear the sounds in is the low frequency range with increased gain. However, the frequency range is not limited to low frequencies (under 500 Hz); the range can be changed according to the hearing requirements of the user. For example, for low frequency hearing impaired people who have difficulty hearing low frequency sound, the specific frequency range can be designed to be a high frequency range (which is over 800 Hz) to increase the gain of the high frequencies of the sound signal such that the low frequency hearing impaired people can clearly hear the sound with the increased gain.

Finally, the sound adjustment system 1 will execute Step 105: via the sound outputting module, outputting the frequency-converted voice signal or the equalizer-adjusted sound signal.

The sound frequency conversion module 40 sends the frequency-converted voice signal to the sound outputting module 30 so that the speaker of the sound outputting module 30 can play the frequency-converted voice signal such that the user can hear the obvious sound with the increased gain in the specific frequency range.

Please return to Step 102; when executing Step 102, if the sound identification module 20 cannot convert the content of the sound signal to text, the sound identification module 20 will determine that the sound signal is a non-voice signal; at this moment, the sound adjustment system 1 will execute Step 104: if the sound signal is a non-voice signal, adjusting the non-voice signal via the sound equalizer such that the non-voice signal becomes an equalizer-adjusted sound signal.

After the sound identification module 20 determines that the sound signal is a non-voice signal, the determined result will be sent to the sound equalizer 50. The sound equalizer 50 will adjust the non-voice signal such that the non-voice signal becomes an equalizer-adjusted sound signal. In one embodiment of the present invention, the adjustment executed by the sound equalizer 50 applies a default music setting to the non-voice signal and makes the non-voice signal sound more like a specific music setting. For example, the sound equalizer 50 can provide a classical music setting; the classical music setting imitates the sound frequencies of classical musical instruments by increasing the amplitude between 30 Hz to 250 Hz of the non-voice signal, slightly decreasing the amplitude between 250 Hz to 2000 Hz, increasing the amplitude between 2000 Hz to 16000 Hz, and cutting off the amplitudes under 50 Hz and over 16000 Hz; therefore, the frequency composition of the non-voice signal which is adjusted by the classical music setting will be similar to the frequency composition of classical musical instruments and closer to an actual classical music performance. However, the music setting provided by the sound equalizer 50 is not limited to the abovementioned classical music setting; the music setting can also be a setting for rock music, electronic music, or extra bass music.

After the sound equalizer 50 adjusts the non-voice signal such that the non-voice signal becomes an equalizer-adjusted sound signal, the sound adjustment system 1 will execute Step 105: allowing the equalizer-adjusted sound signal to be sent to the sound outputting module 30; therefore, the speaker of the sound outputting module 30 can play the equalizer-adjusted sound signal so that the user can hear the equalizer-adjusted sound signal which is closer to the real music situation.

Via the sound adjustment system 1 and the sound adjustment method of the present invention, the type of the sound can be automatically identified as a voice signal or a non-voice signal; according to the identification result, the frequency of the voice signal will be adjusted automatically or a specific music setting will be applied to the non-voice signal such that the user will hear a clear voice with adjusted frequencies or hear music which is closer to the real music situation to obtain a better listening experience.

What is claimed is:

1. A sound adjustment method, applied to a sound adjustment system, wherein the sound adjustment system applied to a smartphone comprises a sound receiving module, a sound identification module, a sound frequency conversion module and a sound equalizer, wherein the sound receiving module is a microphone, the sound identification module is used for identifying if a type of a sound signal is a voice signal or a non-voice signal, and the sound frequency conversion module is used for executing a frequency conversion of the voice signal such that the voice signal becomes a frequency-converted voice signal, the sound adjustment method comprising:

via the sound receiving module, receiving the sound signal;

via the sound identification module, identifying the sound signal to determine the type of the sound signal;

if the sound signal is the voice signal, executing the frequency conversion of the voice signal via the sound frequency conversion module such that the voice signal becomes the frequency-converted voice signal; and if the sound signal is the non-voice signal, adjusting the non-voice signal via the sound equalizer such that the non-voice signal becomes an equalizer-adjusted sound signal.

2. The sound adjustment method as claimed in claim 1, wherein the sound identification module is used for identifying if the sound signal can be converted to text to determine if the sound signal is the voice signal.

3. The sound adjustment method as claimed in claim 2, wherein the sound adjustment system further comprises a sound outputting module, the sound outputting module is a speaker, the sound outputting module is electrically connected to the sound frequency conversion module and the sound equalizer, and the sound outputting module is used for outputting the frequency-converted voice signal or the equalizer-adjusted sound signal.

4. A sound adjustment system, applied to a smartphone, comprising:

a sound receiving module, which is a microphone for receiving a sound signal;

a sound identification module, electrically connected to the sound receiving module, wherein the sound identification module is used for identifying the sound signal to determine a type of the sound signal;

a sound frequency conversion module, electrically connected to the sound identification module, wherein the sound frequency conversion module is used for executing a frequency conversion of the voice signal such that the voice signal becomes a frequency-converted voice signal; and a sound equalizer, electrically connected to the sound identification module;

if the sound identification module determines that the sound signal is a voice signal, the sound frequency conversion module will execute the frequency conversion of the voice signal such that the voice signal becomes the frequency-converted voice signal; if the sound identification module determines that the sound signal is a non-voice signal, the sound equalizer will adjust the sound signal such that the non-voice signal becomes an equalizer-adjusted sound signal.

5. The sound adjustment system as claimed in claim 4, wherein the sound identification module is used for identifying if the sound signal can be converted to text to determine if the sound signal is the voice signal.

6. The sound adjustment system as claimed in claim 5, further comprising a sound outputting module, and the sound outputting module is a speaker; the sound outputting module is electrically connected to the sound frequency conversion module and the sound equalizer, and the sound outputting module is used for outputting the frequency-converted voice signal or the equalizer-adjusted sound signal.

* * * * *